(12) United States Patent
Kurihara et al.

(10) Patent No.: US 6,791,880 B1
(45) Date of Patent: Sep. 14, 2004

(54) NON-VOLATILE MEMORY READ CIRCUIT WITH END OF LIFE SIMULATION

(75) Inventors: Kazuhiro Kurihara, Sunnyvale, CA (US); Binh Quang Le, San Jose, CA (US); Pau-Ling Chen, Saratoga, CA (US); Darlene Hamilton, San Jose, CA (US); Edward Hsia, Saratoga, CA (US)

(73) Assignee: FASL, LLC, Sunnyvale, CA (US)

( * ) Notice: Subject to any disclaimer, the term of this patent is extended or adjusted under 35 U.S.C. 154(b) by 0 days.

(21) Appl. No.: 10/431,320

(22) Filed: May 6, 2003

(51) Int. Cl.[7] ............................................. G11C 16/06

(52) U.S. Cl. .............................. 365/185.21; 365/185.2; 365/210

(58) Field of Search ......................... 365/185.21, 185.2, 365/210

(56) References Cited

U.S. PATENT DOCUMENTS

2002/0145910 A1 * 10/2002 Kern et al. ............ 365/185.21

* cited by examiner

Primary Examiner—Huan Hoang

(57) ABSTRACT

A non-volatile memory read circuit having adjustable current sources to provide end of life simulation. A flash memory device comprising a reference current source used to provide a reference current for comparison to the current of a memory cell being read, includes an adjustable current source in parallel with the memory cell being read, and an adjustable current source in parallel with the reference current source. The current from the memory cell, reference current source, and their parallel adjustable current sources are input to cascode circuits for conversion to voltages that are compared by a sense amplifier. The behavior of the cascode circuits and sense amplifier in response to changes in the memory cell and reference current source may be evaluated by adjusting the adjustable current sources so that the combined current at each input to the sense amplifier simulates the current of the circuit after aging or cycling.

19 Claims, 5 Drawing Sheets

NON-VOLATILE MEMORY READ CIRCUIT WITH END OF LIFE SIMULATION

TECHNICAL FIELD

The present invention relates to a non-volatile memory. Specifically, the present invention relates to a read circuit for a non-volatile memory device.

BACKGROUND ART

Many electronic devices, such as computers, personal digital assistants, cellular telephones, digital cameras and similar systems and devices include processors and memory. The memory is used to store computer programs to be executed by the device and/or data operated on by the processors to achieve the functionality of the device. Many devices and systems require that this information be retained in permanent storage non-volatile medium so that the data and computer programs is not lost when power is removed.

Flash memory is an example of a non-volatile memory device. Flash memory devices use a memory cell transistor that is similar to a metal-oxide semiconductor field effect transistor (MOSFET) with an additional floating gate structure disposed in the insulating layer between the control gate, and the source and drain. The channel between the source and drain is separated from the floating gate by a thin dielectric layer.

Programming of a memory cell is done by applying the appropriate potentials to the control gate, source, and drain so that electrons are transferred to the floating gate through the thin dielectric layer. The addition of electrons to the floating gate increases the threshold voltage for the transistor above the value for an uncharged floating gate. A read operation is performed by biasing the source and drain while applying a read voltage that is above the threshold voltage ($V_1$) for an unprogrammed cell and below the threshold voltage for a programmed cell. An unprogrammed cell will conduct current at the applied read voltage, and thus represents a logical "1", whereas a programmed cell will not conduct, and represents a logical "0." The erasure of a memory cell is carried out by applying potentials to the control gate, source, and drain so that electrons are removed from the floating gate, thus lowering the threshold voltage.

Conventional flash memory devices utilize transistors that store a single bit per transistor and have a floating gate that is a conductor, such as polysilicon. Multi-bit memory cells have been developed that allow for storing more than one bit per transistor. These transistors may use a single floating gate with multiple programming levels, a split floating gate to provide more than one charge storage site, or a dielectric layer (in place of a floating gate) in which charge may be locally stored in multiple sites.

An example of a dielectric layer used for charge storage is a composite ONO layer (silicon nitride sandwiched between two layers of silicon dioxide). This layer may be used in a dual-bit memory cell that can store two bits per cell; however, the aging and cycling characteristics of the ONO layer are different from the conventional polysilicon floating gate.

When used for charge storage in a memory cell, an ONO layer may develop an increase in charge loss with cycling, giving rise to difference I-V characteristics at the end of life as compared to the I-V characteristics at the beginning of life for the device. In order to accommodate the changing I-V characteristics in the read operation, a dynamic reference array is used in place of a static reference. A dynamic reference array includes a set of memory cells that are programmed and erased along with the core memory cells of a flash memory device. Thus, the aging associated with the ONO layer essentially becomes a common mode error that can be canceled out by being introduced at both inputs of the comparator used in the read operation.

Although the error produced by aging of memory cells using an ONO layer can be dealt with by using a dynamically programmed reference array, there is still a problem with respect to the overall change in current loads in the read circuit. Although the difference error may be eliminated, the overall change in current levels is still a concern with respect to the operation of the read circuit. Since aging typically produces an increase in the cell drain-source current ($I_{ds}$) at a given gate voltage ($V_g$), the read circuit will generally have to deal with overall higher currents towards the end of life (EOL) as compared to the beginning of life (BOL), and thus there is uncertainty whether the read circuit will continue to perform properly with age.

DISCLOSURE OF THE INVENTION

A flash memory read circuit having adjustable current sources to provide end of life simulation is disclosed. A flash memory device comprising a reference current source used to provide a reference current for comparison to the current of a memory cell being read, includes an adjustable current source in parallel with the memory cell being read, and an adjustable current source in parallel with tile reference current source. The current from the memory cell, reference current source, and their parallel adjustable current sources are input to cascode circuits for conversion to voltages that are compared by a sense amplifier. The behavior of the cascode circuits and sense amplifier in response to changes in the memory cell and reference current source may be evaluated by adjusting the adjustable current sources so that the combined current at each input to the sense amplifier simulates the current of the circuit after aging or cycling.

In an embodiment of the present invention, a non-volatile memory cell is coupled to a sense amplifier by a first cascode circuit that performs a current to voltage conversion to provide a voltage signal to one input of the sense amplifier. An adjustable current source is connected in parallel with the memory cell so that the total current input to the first cascode circuit may be adjusted. A reference current source is coupled to a second input of the sense amplifier by a second cascode circuit. The reference current source also has an adjustable current source connected in parallel, so that the total current input into the second cascode circuit may be adjusted.

In an embodiment of the present invention, a non-volatile memory cell is coupled to a sense amplifier by a first cascade circuit that performs a current to voltage conversion to provide a voltage signal to one input of the sense amplifier. An adjustable current source is connected in parallel with the memory cell so that the total current input to the first cascode circuit may be adjusted. A reference current source is coupled to a second input of the sense amplifier by a second cascode circuit. The reference current source comprises at least two reference memory cells. The reference memory cells may or may not be dynamically programmed. Each of the reference memory cells has an adjustable current source connected in parallel, so that the total current input into the second cascode circuit may be adjusted.

BRIEF DESCRIPTION OF THE DRAWINGS

Prior Art

BEST MODES FOR CARRYING OUT THE INVENTION

Reference will now be made in detail to the preferred embodiments of the present invention, a non-volatile memory read circuit with end of life simulation. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
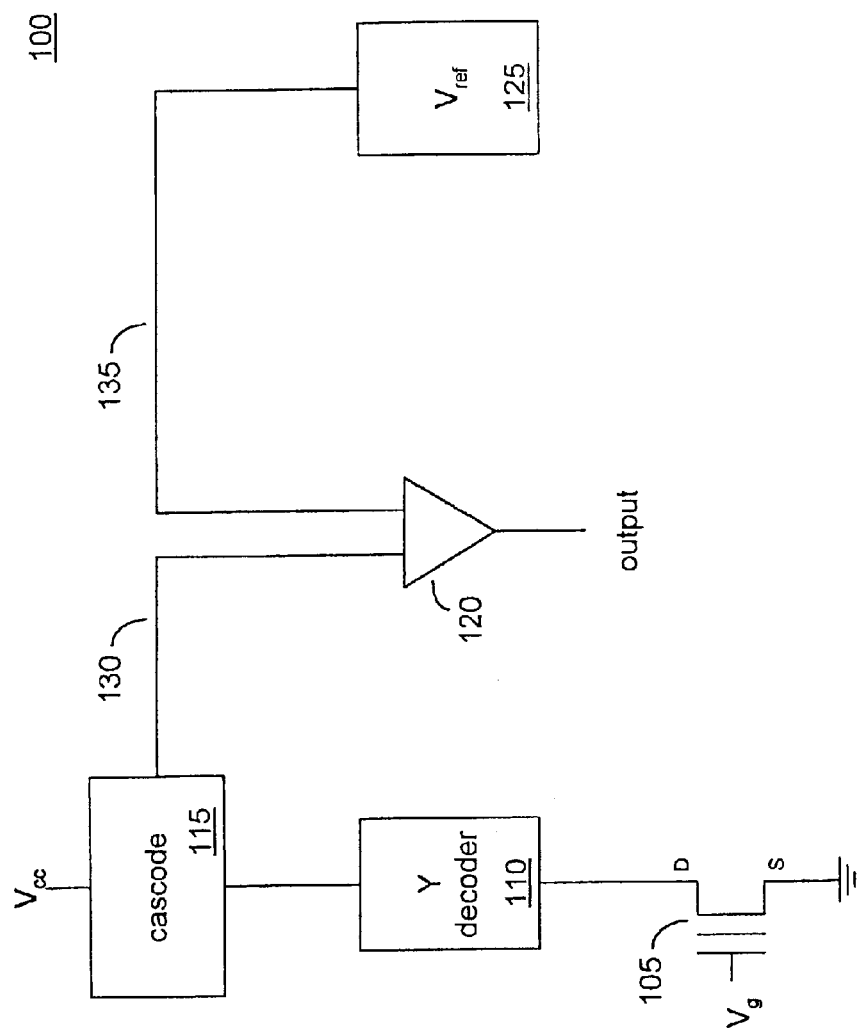
FIG. 1 shows a schematic of a basic memory cell read circuit.

Prior Art FIG. 1 shows a schematic of a basic memory cell read circuit. A non-volatile memory cell 105 is coupled to a cascode circuit 115 by Y-decoder 110. Memory cell 105 is typically selected from an array of cells arranged in rows (X-dimension) and columns (Y-dimension). The Y-decoder selects a column (bitline) and an X-decoder(not shown) selects a row (wordline). A read voltage ($V_g$) is applied to the gate of the memory cell being read and a drain-source voltage ($V_{ds}$) is applied on the bitline. $V_{ds}$ is derived from $V_{ee}$ applied to the cascode 115. The cascode 115 converts the $I_{ds}$ of the memory cell to a read voltage signal 130 that is coupled to one input of the sense amplifier 120. The sense amplifier 120 has a second input coupled to a reference voltage source 125 that provides a reference voltage signal 135. The sense amplifier 120 functions as a comparator that determines the logic state of the memory cell by comparing the read voltage signal level to the reference voltage level ($V_{ref}$). Typically, the reference voltage source 125 is a circuit that is external to the array containing the memory cell being read.

The behavior of oxide-nitride-oxide (ONO) based memory cells is very different from polysilicon floating gate memory cells. Localized point defects in the thin oxide layer have relatively little impact since the nitride is a dielectric, and the mobility of electrons stored in the nitride is much smaller than the mobility of electrons in a conductor such as polysilicon.

A local defect in the thin oxide portion of the ONO layer will only affect a small portion of the stored charge in the nitride. Thus, a point defect may alter the behavior of the ONO memory cell by allowing the loss of a small amount of charge, but it will not lead to a complete failure. Over time, the combination of cycling, time, and temperature may increase the number of point defects in the oxide, producing a gradually increasing charge loss characteristic in the memory cell.

Figure 2:
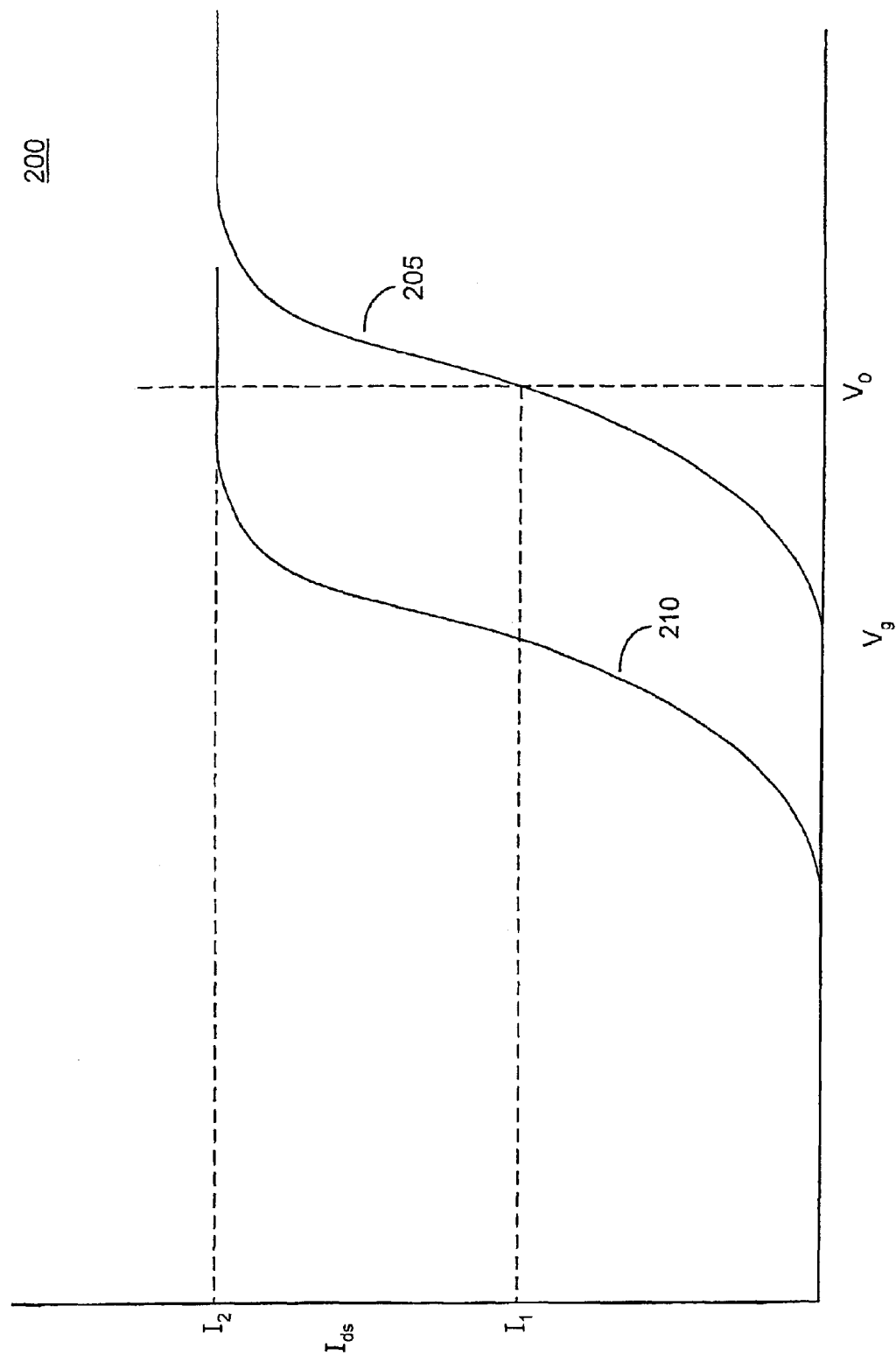
FIG. 2 shows a graphic comparison of the beginning of life (BOL) and end of life (EOL) I-V characteristics for a memory cell with an ONO charge storage layer in accordance with an embodiment of the present claimed invention.

FIG. 2 shows a plot 200 of memory cell current ($I_{ds}$) versus gate voltage ($V_g$) for the beginning of life (BOL) 205 and end of life (EOL) 210 for a memory cell with an ONO charge storage layer. The effect of increased charge loss in the memory cell is reflected in the shift of the memory cell I-V characteristic at BOL 205 to 210 at EOL. At EOL, the memory cell does not program as well as at BOL. For a given $V_g=V_0$. The EOL memory cell current $I_2$ will be greater than the BOL current $I_1$.

The increased memory cell current at EOL will place a greater demand on the cascode/sense amplifier portion of the read circuit. Since there is typically a tradeoff between input dynamic range and sensitivity for an amplifier, there is a limit as to how much headroom the amplifier will have for handling the increase current at end of life.

Figure 3:
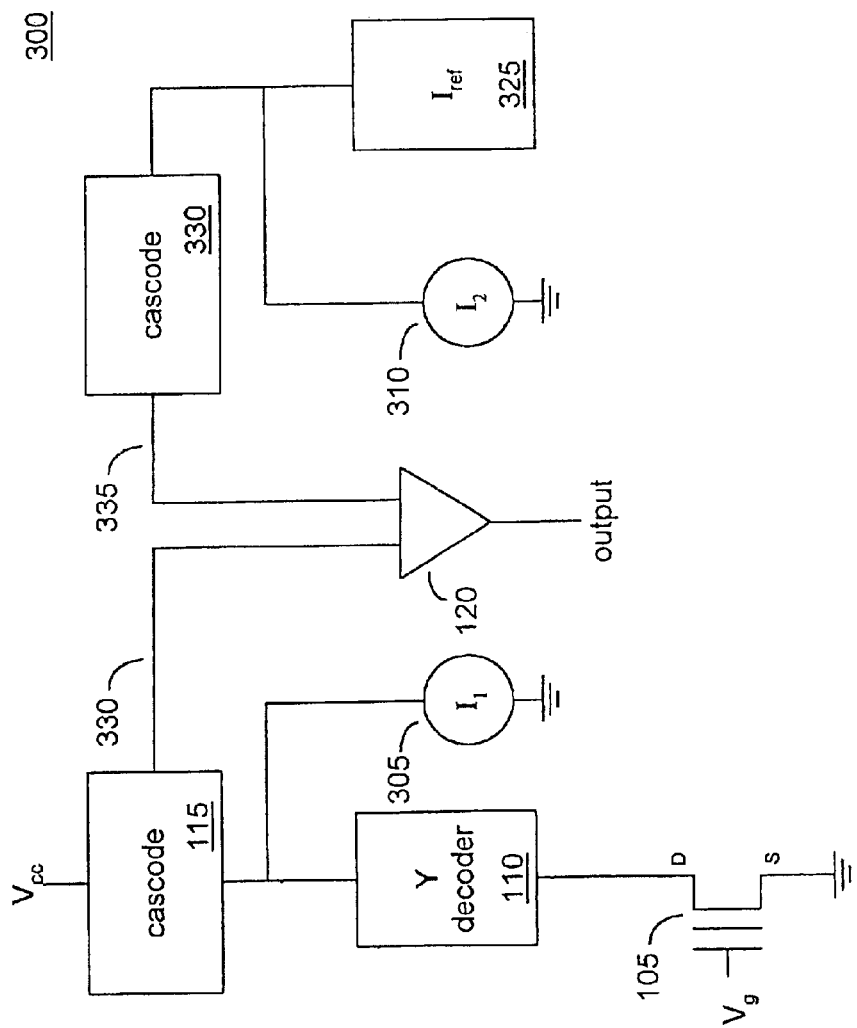
FIG. 3 shows a read circuit with a single reference current source in accordance with an embodiment of the present claimed invention.

FIG. 3 shows a read circuit 300 with a single reference current source in accordance with an embodiment of the present invention. The read circuit 300 comprises a non-volatile memory cell 105 coupled to a cascode circuit 115 by a Y-decoder 110. A first adjustable current source 305 is coupled to the cascode circuit 115 in parallel with the memory cell 105. Thus, the total current input to the cascode circuit 115 is the sum of the current from the memory cell 105 and the current $I_1$ from the first adjustable current source 305. In cases where the non-volatile memory cell 105 uses a dielectric charge storage medium such as an ONO layer, the preferred range for the adjustable current source 305 is from about 5 microamperes to 35 microamperes. This current range is preferred in part because it allows for simulation of the EOL behavior of an ONO non-volatile memory cell. The read voltage signal 330 is output from the cascode 115 to a first input of the sense amplifier 120. A reference voltage signal 335 is coupled to the second input of the sense amplifier 120.

The reference voltage signal 335 is obtained from a second cascode circuit 330 that has an input current that is the sum of the current $I_{ref}$ from a reference current source 325 and the current $I_2$ from an adjustable current source $I_2$. The reference current source may or may not comprise a memory cell similar to memory cell 105, but is typically internal to the memory device. Depending upon the design and process used to fabricate the reference current source 325, there may be aging characteristics that produce a drift over time. A second adjustable current source 310 is coupled to the second cascode 330 in parallel with the reference current source 325. The adjustable current source 310 provides EOL simulation for the reference current source, so that the BOL behavior of the sense amplifier 120 and both of its inputs may be evaluated. The adjustable current source 310 also provides a means for providing an offset current that can be used to compensate for drift in the reference current source 325 and/or the cascode circuit 330.

Figure 4:
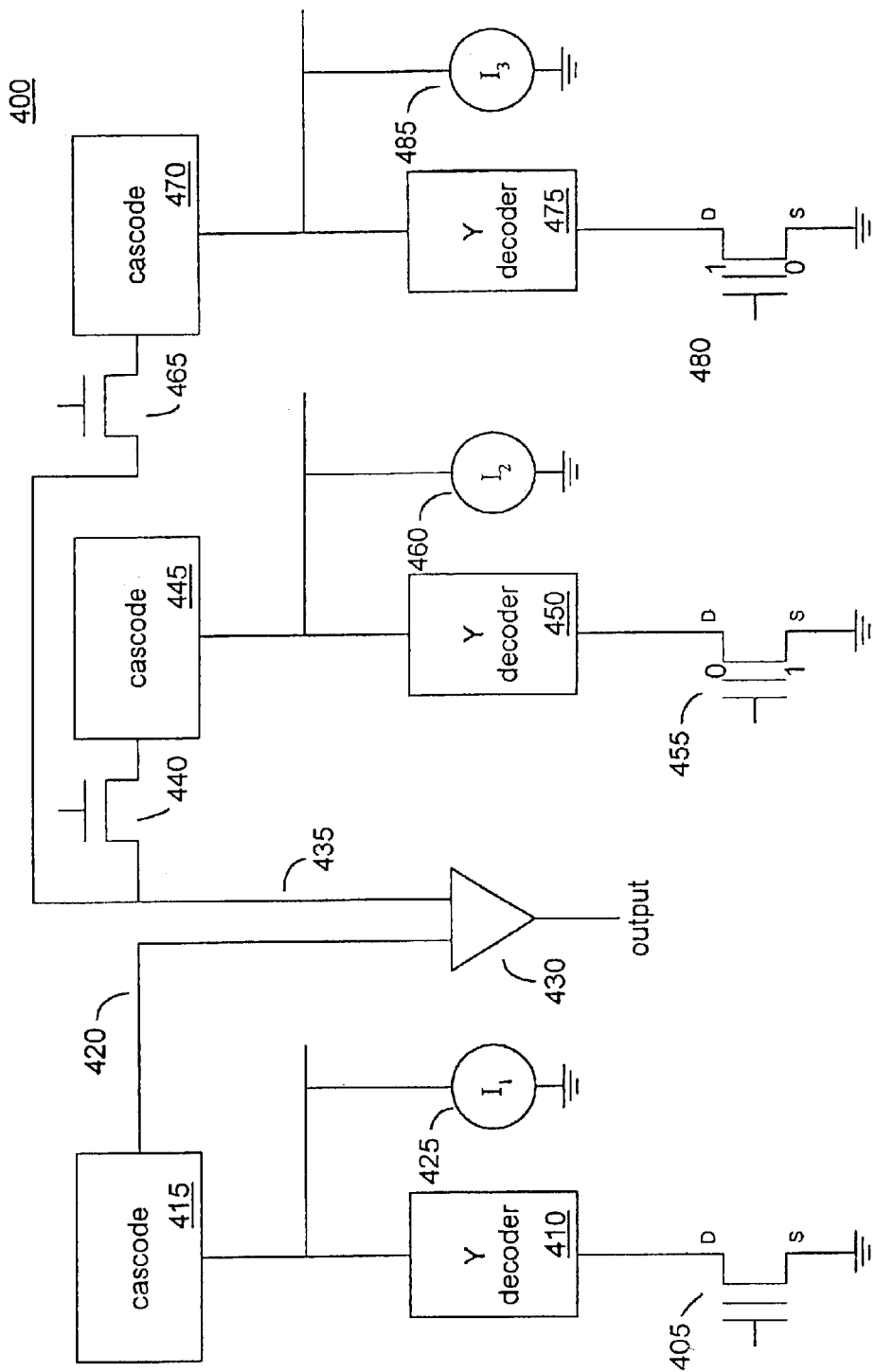
FIG. 4 shows a read circuit with multiple reference current sources in accordance with an embodiment of the present claimed invention.

FIG. 4 shows a read circuit with multiple reference current sources in accordance with an embodiment of the present invention. The read circuit 400 comprises a non-volatile memory cell 405 coupled to a cascode circuit 115 by a Y-decoder 410. In this embodiment, the memory cell 405 comprises a dielectric charge storage medium (e.g., an ONO layer). A first adjustable current source 425 is coupled to the cascode circuit 415 in parallel with the memory cell 405. Thus, the total current input to the cascode circuit 415 is the sum of the current from the memory cell 405 and the current $I_1$ from the first adjustable current source 325. In cases where the non-volatile memory cell 405 uses a dielectric charge storage medium such as an ONO layer, the preferred range for the adjustable current source 425 is from about 5 microamperes to 35 microamperes. The read voltage signal 420 is output from the cascode 415 to a first input of the sense amplifier 430. A reference voltage signal 435 is coupled to the second input of the sense amplifier 420.

The second input of the sense amplifier 430 is coupled to a second cascode 445 and a third cascode 470 by switches (e.g., transistors) 440 and 465, respectively. The output of cascode 445 and cascode 470 provide the reference voltage signal 435 to the sense amplifier 430. The current to voltage conversion of the cascodes 445 and 470 may also provide attenuation relative to the conversion of cascode 415. For example, cascode 445 and cascade 470 may each provide 3 dB of attenuation, resulting in a combined output that is an average of their inputs when switches 440 and 465 are closed.

Cascode 445 is coupled to reference memory cell 455 by Y-decoder 450. A second adjustable current source 460 is coupled to cascode 445 in parallel with memory cell 455. Reference memory cells 455 and 480 are essentially the same as core memory cell 405, and may be dynamically programmed. Dynamic programming is distinguished from static programming in that a statically programmed reference cell is programmed with a reference value once and then used without reprogramming, whereas a dynamically programmed reference memory cell is programmed and erased along with the core memory cell with which it is being used. A dynamically programmed reference cell undergoes the same aging and cycling as the core memory cell with which it is associated.

In cases where the non-volatile memory cell 455 uses a dielectric charge storage medium such as an ONO layer, the preferred range for the adjustable current source 425 is from about 5 microamperes to 35 microamperes.

Cascode 470 is coupled to reference memory cell 480 by Y-decoder 475. A second adjustable current source 460 is coupled to cascode 470 in parallel with memory cell 480. In cases where the non-volatile memory cell 480 uses a dielectric charge storage medium such as an ONO layer, the preferred range for the adjustable current source 485 is from about 5 microamperes to 35 microamperes. Memory cell 480 may have its read bit programmed with a logic value (e.g., 1) that is the complement of the logical value of memory cell 455 (e.g., 0)as shown.

Figure 5:
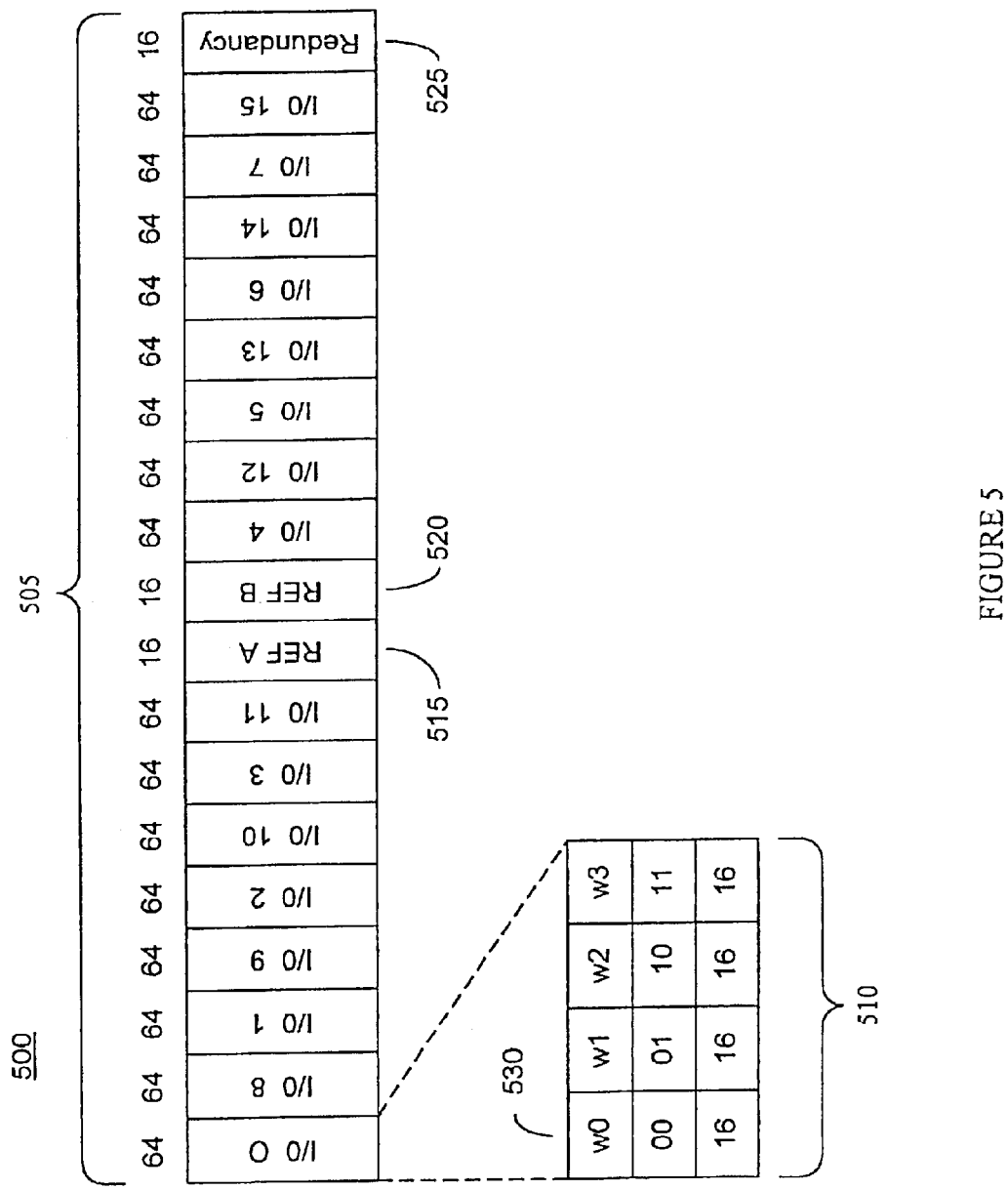
FIG. 5 shows a memory cell array sector layout with reference blocks in accordance with an embodiment of the present claimed invention.

FIG. 5 shows an example of a memory cell array sector layout 500. A sector 505 comprises I/O blocks I/O0–I/O15 that form the core memory array, reference blocks 515 and 520, and a redundancy block 525. As shown, the redundancy block may be physically separate from the remainder of the sector. Each 110 block 510 comprises 4 sub-I/Os 530, each with a width of 16 cells. Each sub-I/O (w0, w1, w2, w3) has an associated word number (00, 01, 10, 11). Thus, for a word length of 16 cells, each I/O block is four words (or 64 cells) wide. The reference blocks 515 and 520, and the Redundancy block 525 are each 16 cells wide. Thus, the basic unit of width for the sector 505 is 16 cells, and a common Y-decoder structure with an addressable width of 16 cells may be used to address each block. The total number of decoders required is 67, with 64 decoders for the 16 I/O blocks I/O0–I/O15, 2 decoders for the reference blocks 515 and 520, and one decoder for the redundancy block 525. The sector 505 has an overall width of 1072 cells, and may have a height of about half of the width, e.g., 512 cells high. The inclusion of the reference memory cells in the same sector as the core memory cells, combined with dynamic, programming, provide optimum tracking of the reference memory cells and core memory cells at BOL and EOL.

While the present invention of a non-volatile memory read circuit with end of life simulation has been described in particular embodiments, it should be appreciated that the present invention should not be construed as limited by such embodiments, but rather construed according to the below claims.

What is claimed is:

1. A read circuit for a non-volatile memory device comprising:

a sense amplifier;

a non-volatile memory cell coupled to said sense amplifier;

a first adjustable current source coupled in parallel with said memory cell and having a current range of about 5 microamperes to 35 microamperes;

a reference current source coupled to said sense amplifier; and a second adjustable current source coupled in parallel with said reference current source and having a current range of about 5 microamperes to 35 microamperes.

2. The read circuit of claim 1, wherein said non-volatile memory cell is a dual-bit memory cell.

3. The read circuit of claim 1, wherein said non-volatile memory cell comprises a dielectric charge storage layer.

4. The read circuit of claim 1, wherein said reference current source is a non-volatile memory cell.

5. The read circuit of claim 4, wherein said non-volatile memory cell is dynamically programmed.

6. A read circuit for a non-volatile memory device comprising:

a sense amplifier;

a non-volatile memory cell coupled to said sense amplifier;

a first adjustable current source coupled in parallel with said memory cell;

a first reference current source coupled to said sense amplifier;

a second adjustable current source coupled in parallel with said first reference current source;

a second reference current source coupled to said sense amplifier; and a third adjustable current source coupled in parallel with said second reference current source.

7. The read circuit of claim 6, wherein said non-volatile memory cell is a dual-bit memory cell.

8. The read circuit of claim 6, wherein said non-volatile memory cell comprises a dielectric charge storage layer.

9. The read circuit of claim 6, wherein said reference current source is a non-volatile memory cell.

10. The read circuit of claim 9, wherein said non-volatile memory cell is dynamically programmed.

11. The read circuit of claim 6, wherein each of the adjustable current sources have a current range of about 5 microamperes to 35 microamperes.

12. A flash memory device comprising:
a first memory cell coupled to a first cascode circuit;
a first adjustable current source coupled to said cascode circuit in parallel with said first memory cell;
a sense amplifier having a first input coupled to said first cascode circuit;
a second memory cell coupled to a second cascode circuit, wherein said second cascode circuit is coupled to a second input of said sense amplifier;
a second adjustable current source coupled to said second cascode circuit in parallel with said second memory cell;
a third memory cell coupled to a third cascode circuit, wherein said third cascode circuit is coupled to said second input of said sense amplifier; and
a third adjustable current source coupled to said second cascode circuit in parallel with said third memory cell.

13. The flash memory device of claim 12, wherein each of the memory cells is coupled to its respective cascode circuit by a Y-decoder.

14. The flash memory device of claim 12, wherein said second and third memory cells are dynamically programmable.

15. The flash memory device of claim 12, wherein said second and third cascode circuits are each coupled to said second input of said sense amplifier by a switch.

16. The flash memory device of claim 12, wherein each of the memory cells is a dual-bit memory cell having a first bit and a second bit.

17. The flash memory device of claim 12, wherein the first bit of said second memory cell is programmed, first bit of said third memory cell is unprogrammed, the second bit of said second memory cell is unprogrammed, and the second bit of said third memory cell is programmed.

18. The flash memory device of claim 12, wherein each of the memory cells comprises a dielectric layer for storing charge.

19. The flash memory device of claim 12, wherein each of the adjustable current sources has a current range of about 5 microamperes to 35 microamperes.

* * * * *